US008598658B2

(12) United States Patent
Fang et al.

(10) Patent No.: US 8,598,658 B2
(45) Date of Patent: Dec. 3, 2013

(54) HIGH VOLTAGE LDMOS DEVICE

(75) Inventors: Jian Fang, Sichuan (CN); Lvyun Chen, Sichuan (CN); Wenchang Li, Sichuan (CN); Chao Guan, Sichuan (CN); Qiongle Wu, Sichuan (CN); Wenbin Bo, Sichuan (CN); Zehua Wang, Sichuan (CN)

(73) Assignee: University of Electronic Science and Technology of China, Sichuan (CN)

( * ) Notice: Subject to any disclaimer, the term of this patent is extended or adjusted under 35 U.S.C. 154(b) by 0 days.

(21) Appl. No.: 13/577,360

(22) PCT Filed: Apr. 28, 2011

(86) PCT No.: PCT/CN2011/073437
§ 371 (c)(1),
(2), (4) Date: Aug. 6, 2012

(87) PCT Pub. No.: WO2012/055225
PCT Pub. Date: May 3, 2012

(65) Prior Publication Data
US 2013/0214355 A1 Aug. 22, 2013

(30) Foreign Application Priority Data
Oct. 28, 2010 (CN) .......................... 2010 1 0523281

(51) Int. Cl.
*H01L 29/78* (2006.01)
*H01L 29/08* (2006.01)

(52) U.S. Cl.
USPC ..... 257/342; 257/409; 257/341; 257/E29.256

(58) Field of Classification Search
None
See application file for complete search history.

(56) References Cited

U.S. PATENT DOCUMENTS 6,768,169 B2 * 7/2004 Tihanyi .......................... 257/341
6,833,585 B2 * 12/2004 Kim et al. ...................... 257/343
(Continued)

FOREIGN PATENT DOCUMENTS

| CN | 1695255 A | 11/2005 |
|----|-----------|---------|
| CN | 101300679 A | 11/2008 |
| CN | 101510561 A | 8/2009 |
| CN | 101553932 A | 10/2009 |
| CN | 101719515 A | 6/2010 |
| CN | 101969074 A | 2/2011 |

OTHER PUBLICATIONS

International Search Report for PCT/CN2011/073437 Aug. 4, 2011.
(Continued)

*Primary Examiner* — Thomas L Dickey
*Assistant Examiner* — Joseph Schoenholtz
(74) *Attorney, Agent, or Firm* — Pearne & Gordon LLP

(57) ABSTRACT

A high voltage lateral double diffused metal-oxide-semiconductor field effect transistor (LDMOS) comprises a substrate; an epitaxy layer on the substrate; a drift region on the epitaxy layer; and a drain region and a source region at two ends. At least one pair of n-type and p-type semiconductor regions is arranged alternately above the interface of the substrate and the epitaxy layer and firmly attached to a lower surface of the drifting region; the n-type and p-type semiconductor regions are firmly closed to each other and arranged to form a lateral PN junction; and the p-type semiconductor region and the drifting region form a vertical PN junction. The n-type and p-type semiconductor regions are also totally called "a reduced surface field (RESURF) layer in body", and the LDMOS device with a RESURF layer in body effectively solves conflict between raising reverse withstand voltage and reducing forward on-resistance of the current LDMOS devices.

5 Claims, 3 Drawing Sheets

(56) References Cited

U.S. PATENT DOCUMENTS

| | | | |
|---|---|---|---|
| 7,202,529 B2 * | 4/2007 | Krumbein et al. | 257/343 |
| 2004/0222461 A1 * | 11/2004 | Peyre-Lavigne et al. | 257/333 |
| 2011/0073904 A1 * | 3/2011 | Ashida et al. | 257/139 |

OTHER PUBLICATIONS

Wu, Jie et al. "A Novel Double RESURF LDMOS with Multiple Rings in Non-uniform Drift Region" IN:IEEE;2004; pp. 349-352.

* cited by examiner

HIGH VOLTAGE LDMOS DEVICE

This application is a National Stage application of PCT international application PCT/CN2011/073437, filed on Apr. 28, 2011 which claims the priority of Chinese Patent Application No. 201010523281.0, entitled "HIGH VOLTAGE LDMOS DEVICE", filed with the Chinese Patent Office on Oct. 28, 2010, both of which are incorporated herein by reference in their entirety.

FIELD OF THE INVENTION

The present invention relates to a semiconductor high-voltage low-resistance device in the field of electronic technology, and particularly to a high voltage LDMOS device.

BACKGROUND OF THE INVENTION

With rapid development of semiconductor industry, Power Integrated Circuit (PIC) has being used in multiple fields, such as a motor control, a panel display drive control, and a control of driving computer peripheral equipment. Among the power devices adopted in the PIC, a high voltage device, Lateral Double Diffused MOSFET (LDMOS), is paid more attention due to its characteristics of high working voltage, simple technology, facilitation for compatible with low voltage Complementary Metal Oxide Semiconductor (CMOS) circuit in technology and the like. However, for semiconductor high voltage power device made of material of Si, the forward on-resistance of the LDMOS device is greater than that of the Vertical Double Diffused MOSFET (VDMOS), and the greater the forward on-resistance, the larger the dimension of the device. Thus, the manufacturing cost is increased.

Referring to FIG. 1, which is a schematic structural diagram of a conventional LDMOS device, the LDMOS device includes a substrate 1, an epitaxial layer 2, a drift region 3, a drain region 4, a well region 5, a source region 6, an oxide layer 7, a source 8, a gate 9, a drain 10 and a substrate electrode 15. In the case that the LDMOS device is of n type, the substrate 1 and the well region 5 are of p type, the epitaxial layer 2 is of n type, the drift region 3 is of n− type, and the drain region 4 and the source drain 6 are of n+ type. In the case that the LDMOS device is of p type, the substrate 1 and the epitaxial layer 2 are of p type, the well region 5 is of n type, the drift region 3 is of p− type, and the drain region 4 and the source drain 6 are of p+ type. The drift region 3 for enduring the voltage endurance in the LDMOS needs to be lightly doped. On the other hand, to decrease the forward on-resistance of the LDMOS device, the drift region 3, as a current channel, needs to be heavily doped. This results in the contradiction between the breakdown voltage BV and the on-resistance $R_{on}$. Taking the common Metal-Oxide-Semiconductor (MOS) device as an example, the relation between the breakdown voltage BV and the on-resistance $R_{on}$ are as follows:

$$R_{on} = \frac{L_D}{q\mu_n N_D} = 5.39 \times 10^{-9} (BV)^{2.5} \text{ (for } N\text{-type } MOS)$$

$$R_{on} = \frac{L_D}{q\mu_p N_D} = 1.63 \times 10^{-8} (BV)^{2.5} \text{ (for } P\text{-type } MOS)$$

Where $L_D$ is the length of the drift region, $N_D$ is the concentration of the drift region, $\mu_n$ and $\mu_p$ are the mobility of the electron and the hole respectively, and q is the electron charge. As can be seen, the on-resistance of the MOS device is directly proportional to the length of the drift region, and is inversely proportional to the concentration of the drift region. That is to say, the shorter the length or the higher the concentration, the smaller the on-resistance. As one of the MOS devices, the LDMOS device has the common characteristic of the MOS device. Therefore, to ensure certain voltage endurance, the length of the drift region 3 of the LDMOS device should not be designed to be too short; and the concentration thereof should not be designed to be too high, otherwise breakdown may occur nearby the PN junction of the well region 5 under the gate 9, decreasing the inverse voltage endurance of the LDMOS device.

SUMMARY OF THE INVENTION

The object of the present invention is to provide a high voltage LDMOS device, to solve the contradiction between the increasing of the reverse voltage endurance and the decreasing of the forward on-resistance in the prior LDMOS device.

To achieve the above object, the technical solution of the present invention is a high voltage LDMOS device, including a substrate, an epitaxial layer located on the substrate, a drift region located on the epitaxial layer, and a drain region and a source region located at the ends of the LDMOS device respectively, where at least one pair of n-type semiconductor region and p-type semiconductor region alternatively arranged adjacent to the lower surface of the drift region on an interface between the substrate and the epitaxial layer, the n-type semiconductor region is adjacent to the p-type semiconductor region to form a lateral PN junction mutually, and the p-type semiconductor region and the drift region form a longitudinal PN junction.

To prevent the PN junction formed by the n-type semiconductor region and the p-type semiconductor region from affecting the electric field of the drain region, a portion of the drift region corresponding to the drain region is extended downwards through the interface between the substrate and the epitaxial layer.

To adjust the charge balance between the drift region and the n-type and p-type semiconductor regions upon reverse voltage endurance of the LDMOS device, a buried layer is added on an interface between the drift region and the n-type and p-type semiconductor regions, in which the doping characteristic of the buried layer is opposite to that of the drift region.

To further adjust charge balance between the drift region and the n-type and p-type semiconductor regions upon reverse voltage endurance of the LDMOS device, a top buried layer is added to the upper surface of the drift region, in which the doping characteristic of the top buried layer is opposite to that of the drift region.

Advantages of the present invention are that the n-type semiconductor region 11 and the p-type semiconductor region 12 in the present invention are collectively referred to as internal Reduce Surface Electric Field (RESURF) layer, the LDMOS device with this internal RESURF layer solves effectively the contradiction between the increasing of the reverse voltage endurance and the decreasing of the forward on-resistance in the prior LDMOS device, therefore the forward on-resistance can be effectively decreased in the case of the same reverse voltage endurance, or alternatively the reverse voltage endurance can be effectively increased in the case of the same forward on-resistance. The structure of the internal RESURF layer in the present invention can not only be applied in the LDMOS, but also be used in common power devices, such as Lateral Insulated-Gate Bipolar Transistor (LIGBT), Static Induction Transistor (SIT), lateral thyristor, and PN diode. With the development of the semiconductor device technology, the method in the present invention can also be adopted to manufacture more power devices having high voltage and low on-resistance.

BRIEF DESCRIPTION OF THE DRAWINGS

The above and other objects, features and advantages of the present invention will be more apparent from the drawings. Among all the drawings, the same reference numeral indicates the same part. It is not intended to draw the Figures in equal proportion in accordance with the actual sizes, but to illustrate the major idea of the present invention.

Figure 1:
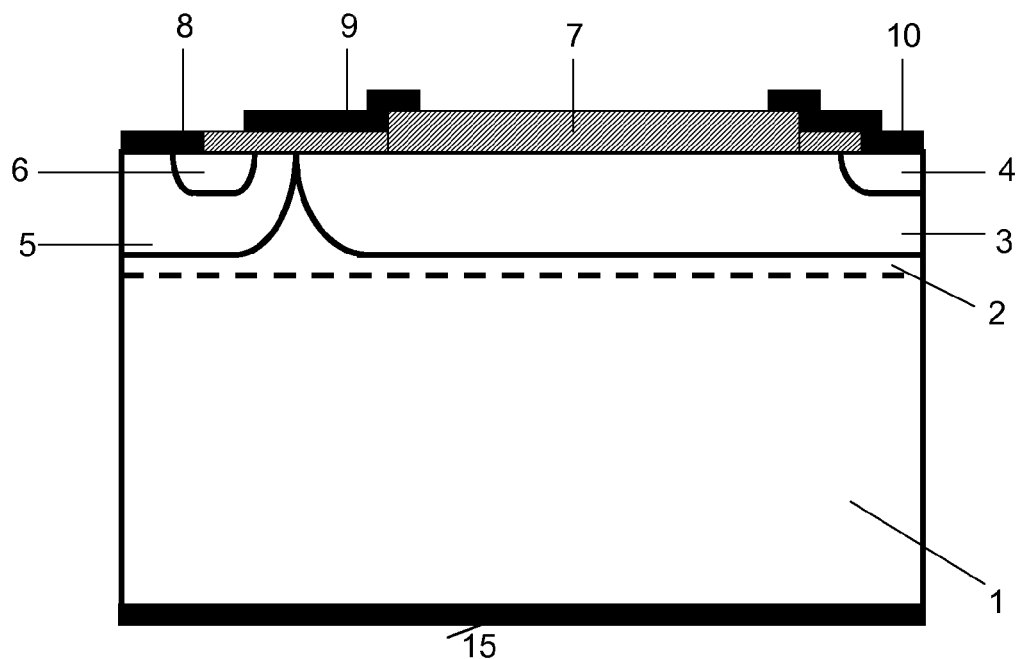
FIG. 1 is a schematic structural diagram of a conventional LDMOS device.

Descriptions for the reference numerals: substrate 1, epitaxial layer 2, drift region 3, drain region 4, well region 5, source region 6, oxide layer 7, source 8, gate 9, drain 10, n-type semiconductor region 11, p-type semiconductor region 12, buried layer 13, top buried layer 14, and substrate electrode 15.

DETAILED DESCRIPTION OF THE INVENTION

The embodiments of the present invention will be described in detail in conjunction with the drawings hereinafter, so that the above objects, features and advantages of the present invention will be more apparent to be understood.

The following disclosure provides a lot of different embodiments or examples, for implementing different structures of the present invention. To simplify the disclosure of the present invention, components and settings of particular examples will be described hereinafter. Indeed, those are only examples but not intended to limit the present invention. Further, reference numerals and/or characters may be repeated in different examples in the present invention. Such repeat is for the purpose of simplification and clarity, which itself does not indicate the relation between various embodiments and/or settings in discussion. Moreover, the structure that the first feature is "on" the second feature in the following description may include the embodiment that a first and a second features are formed as direct contact and also include the embodiment that a further feature is formed between a first and a second features, in which the first and the second feature may not contact directly.

First Embodiment

Figure 2:
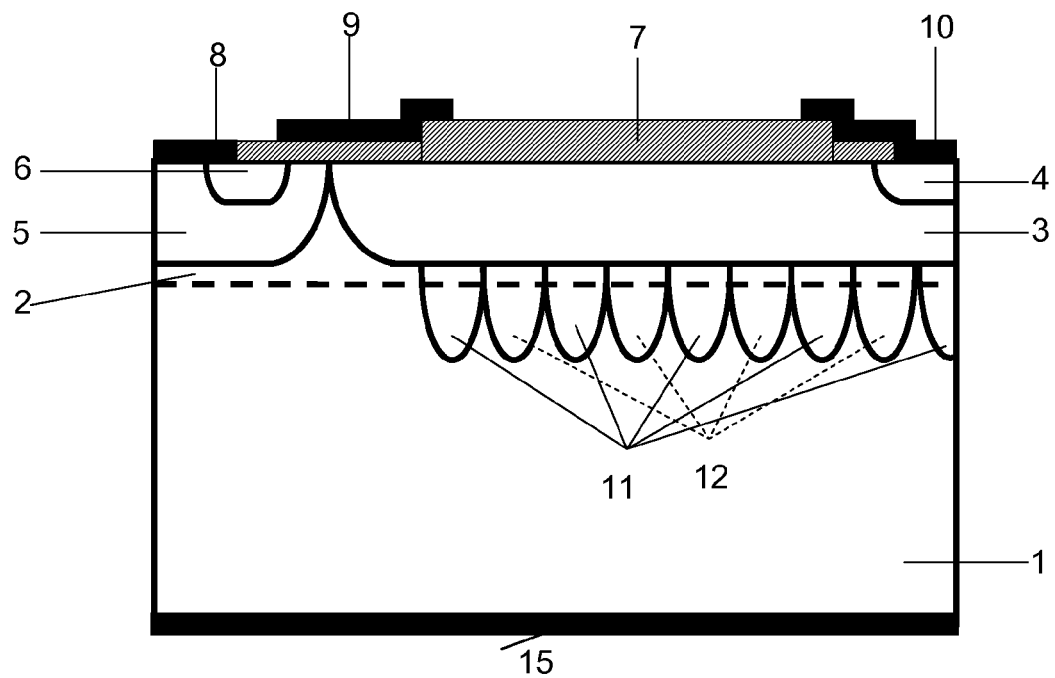
FIG. 2 is a schematic structural diagram of a LDMOS device of a first embodiment of the present invention.

As shown in FIG. 2, a LDMOS device includes a substrate 1, an epitaxial layer 2, a drift region 3, a drain region 4, a well region 5, a source region 6, an oxide layer 7, a source 8, a gate 9, a drain 10 and a substrate electrode 15. In this embodiment, the LDMOS device is described by taking the n-type LDMOS device as an example. In the n-type LDMOS device, the substrate 1 and the well region 5 are of p type, the epitaxial layer 2 is of n type, the drift region 3 is of n− type, and the drain region 4 and the source drain 6 are of n+ type. The epitaxial layer 2 is located on the substrate 1, the drift region 3 is located on the epitaxial layer 2, the drain region 4 and the source region 6 are located at the ends of the LDMOS device respectively, four pairs of n-type semiconductor region 11 and p-type semiconductor region 12 are alternatively arranged adjacent to a lower surface of the drift region 3 on an interface between the substrate 1 and the epitaxial layer 2, the n-type semiconductor region 11 is adjacent to the p-type semiconductor region 12 to form a lateral PN junction mutually, while the p-type semiconductor region 12 and the drift region 3 form a longitudinal PN junction.

Similarly, the above structure is also suitable for the p-type LDMOS device, and the only difference is that the drift region 3 and the n-type semiconductor region form the lateral PN junction.

In this embodiment, for the n-type semiconductor region 11 and the p-type semiconductor region 12, the number of the pair, the shape, the size and the doping concentration can be set arbitrarily as required, and the particular number of the pair, the particular shape and the particular size should not be intercepted as limiting to the present invention.

The working principle of the present invention will be described by taking this embodiment as an example hereinafter.

Firstly, the n-type semiconductor region 11 and the p-type semiconductor region 12 in the present invention are collectively referred to as an internal Reduce Surface Electric Field (RESURF) layer. If the LDMOS device is conducted forwards, the semiconductor region of the RESURF layer that has the same doping characteristic with the drift region 3 constitutes an equivalent resistance in parallel with the drift region 3, therefore the integral on-resistance of the LDMOS device can be effectively decreased and the object of decreasing the conduction loss is achieved, as the following formula: $R_{on}=R_{contact}+R_{source}+R_{channel}+R_{drain}+R_{drift}R_{resurf}/(R_{drift}+R_{resurf})$, in which $R_{on}$ is the on-resistance, $R_{contact}$ is the contact resistance, the $R_{source}$ is the source resistance, the $R_{channel}$ is the channel resistance, $R_{drift}=\rho_d \cdot L_{drift}$ is the drift region resistance, $R_{drain}$ is the drain region resistance, $R_{resurf}$ is the RESURF layer resistance, $\rho_d$ is the epitaxial layer resistivity, and $L_{drift}$ is the length of the drift region.

If the LDMOS device reversely withstands voltage, the lateral PN junctions formed by the n-type semiconductor region 11 and the p-type semiconductor region 12 having opposite doping characteristics in the RESURF layer are depleted mutually in the lateral direction, and the drift region 3 and the longitudinal PN junctions formed by the p-type semiconductor region 12 and the drift region 3 are depleted mutually in the longitudinal direction. If there are several reverse bias PN junctions in the lateral direction, the voltage endurance is the sum of the voltage endurances of the several reverse bias PN junctions. Peak value will occur at each reverse bias PN junction, thus the depletion region is extended in the lateral direction. The electric potential of the RESURF layer falls evenly in the lateral direction, which can effectively induce the surface electric field to become flat and facilitate the increase of the lateral voltage endurance and the decrease of the on-resistance. Meanwhile, in the longitudinal direction, the n-type semiconductor region 11 and the p-type semiconductor region 12 flat the longitudinal electric field, and the longitudinal breakdown voltage is increased. In the conventional LDMOS device, the internal longitudinal breakdown voltage $BV=E_c*t_{epi}$, and the internal longitudinal breakdown voltage BV depends on the longitudinal critical electric field $E_c$ (between the epitaxial layer 2 and the substrate 1) and the thickness of the epitaxial layer 2. When adding the RESURF layer, if the longitudinal breakdown voltage is maintained, the thickness of the epitaxial layer $t_{epi}$ can be greatly decreased. In implementing the RESURF layer, the doping concentration $N_{epi}$ and thickness $t_{epi}$ of the epitaxial layer 2 meet the following formula $N_{epi}*t_{epi}=\in*E_c/q*sqrt(N_{sub}/(N_{epi}+N_{sub}))$, in which $\in$ is the dielectric constant, q is the electron charge, and $N_{sub}$ is the doping concentration of the substrate 1. If the longitudinal critical electric field is determined, $N_{epi}*t_{epi}$ can be seemed as a constant. Thus, if the thickness $t_{epi}$ of the epitaxial layer 2 decreases, the doping concentration $N_{epi}$ of the epitaxial layer 2 will be decreased. It can be seen that the structure provided by this embodiment can decrease the forward on-resistance greatly and decrease the conduction loss of the device after the RESURF layer is introduced, so that the voltage endurance of the LDMOS device is increased in the case of the same forward on-resistance. In addition, the voltage endurance is ensured, the thickness of the epitaxial layer 2 can be decreased, the concentration of the drift region is increased, and the forward on-resistance of the drift region is decreased.

Second Embodiment

Figure 3:
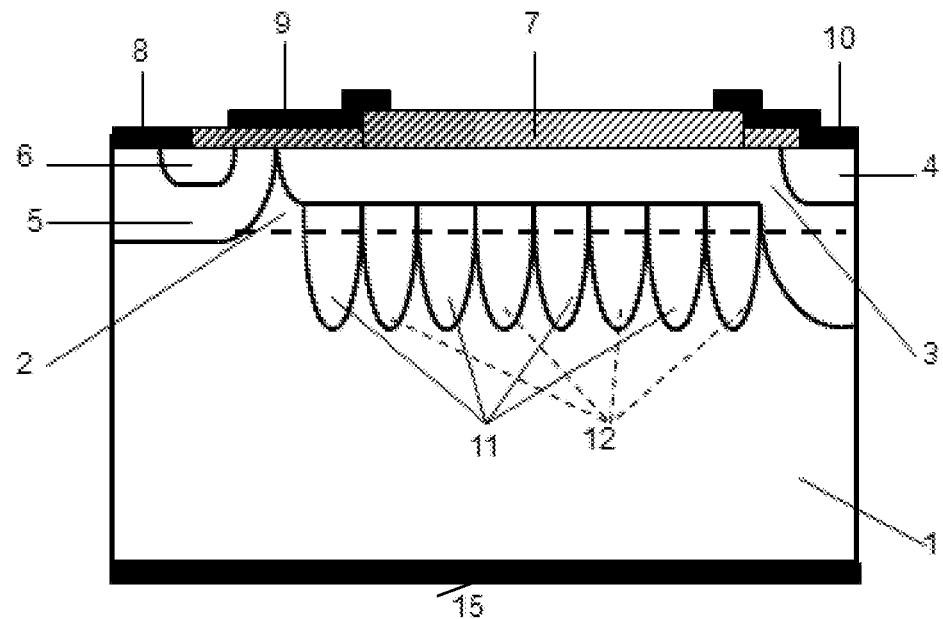
FIG. 3 is a schematic structural diagram of a LDMOS device of a second embodiment of the present invention.

As shown in FIG. 3, based on the first embodiment, to prevent the PN junction formed by the n-type semiconductor region 11 and the p-type semiconductor region 12 from affecting the electric field of the above drain region 4, the portion of the drift region 3 corresponding to the drain region 4 is extended downwards through the interface between the substrate 1 and the epitaxial layer 2.

Third Embodiment

Figure 4:
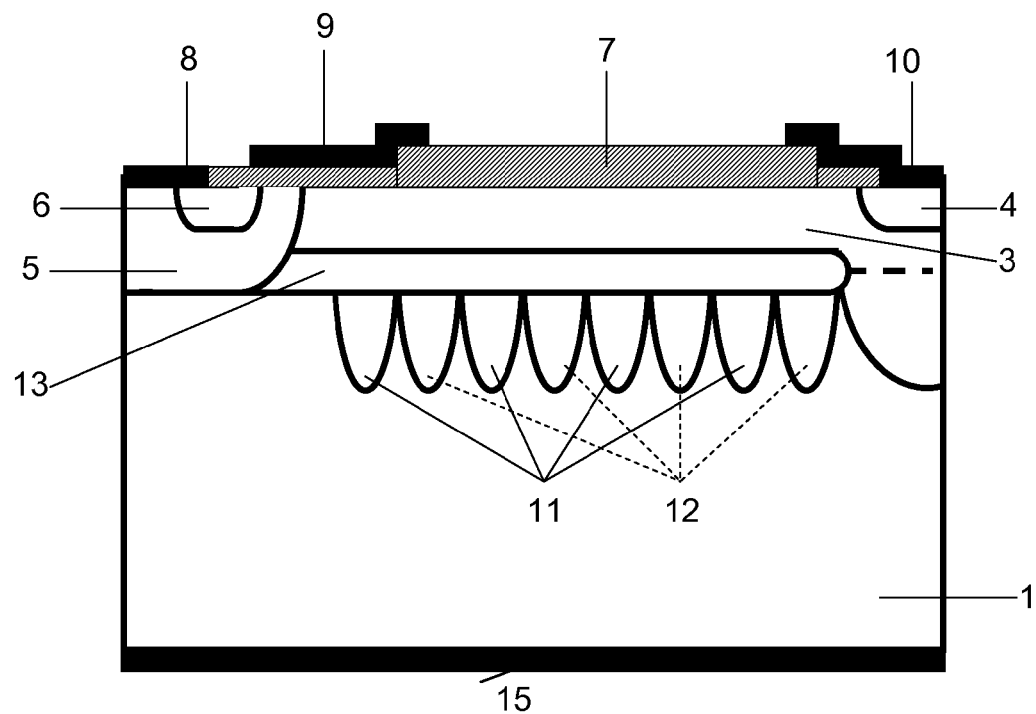
FIG. 4 is a schematic structural diagram of a LDMOS device of a third embodiment of the present invention.

As shown in FIG. 4, based on the first and the second embodiments, to adjust the charge balance between the drift region 3 and the n-type and p-type semiconductor regions 11 and 12 upon reverse voltage endurance of the LDMOS device, a buried layer 13 is added on an interface between the drift region 13 and the n-type and p-type semiconductor regions 11 and 12, in which the doping characteristic of the buried layer 13 is opposite to that of the drift region 3, and the doping concentration of the buried layer 13 is set as required in practice.

Fourth Embodiment

Figure 5:
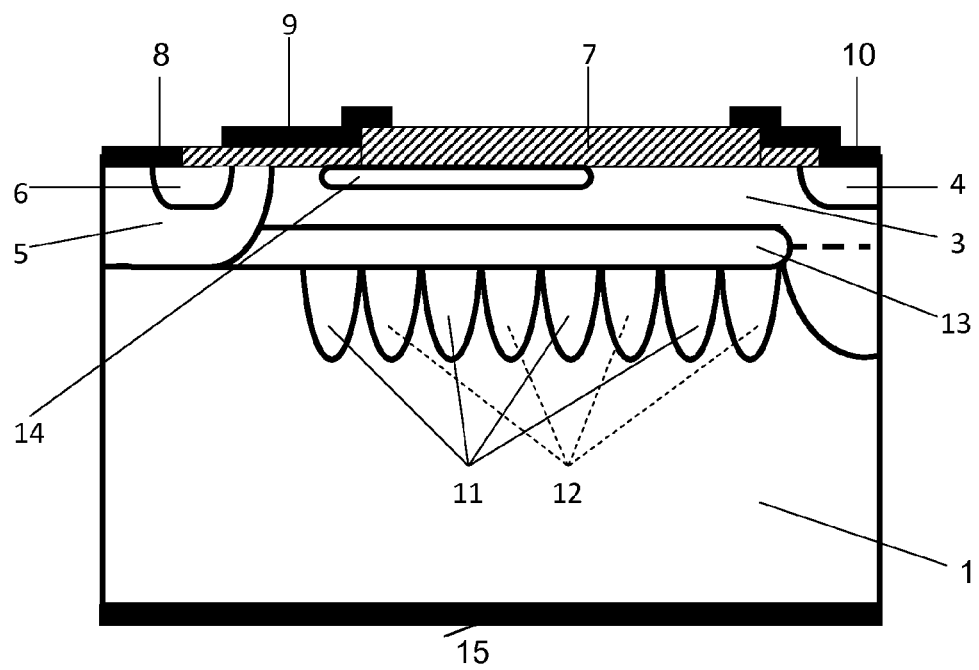
FIG. 5 is a schematic structural diagram of a LDMOS device of a fourth embodiment of the present invention.

As shown in FIG. 5, based on the first, second or third embodiment, to further adjust charge balance between the drift region 3 and the n-type and p-type semiconductor regions 11 and 12 upon reverse voltage endurance of the LDMOS device, a top buried layer 14 is added to the upper surface of the drift region 3, in which the doping characteristic of the top buried layer 14 is opposite to that of the drift region, and the doping concentration of the buried layer 14 is set as required in practice.

Those skilled in the art will realize that the embodiments described herein are intend to help the readers to understand the principle of the present invention, and the scope of protection of the present invention is not limited to such particular descriptions and embodiments. Other various specific variations and combinations can be made by those skilled in the art according to those technical teaches disclosed by the present invention without deviating from the spirit of the present invention, which still fall within the scope of protection of the present invention.

In the present specification, the embodiments are described in progression, each embodiment mainly focuses on the difference aspect from other embodiments, and reference can be made to these similar parts among the embodiments. The above descriptions of the disclosed embodiments enable those skilled in the art to implement or use the present disclosure. Various modifications made to those embodiments will be obvious to those skilled in the art, and the ordinal principles defined in the present disclosure can be implemented in other embodiments without departing from the spirit or the scope of the present disclosure. Therefore, the present invention should not be limited to those embodiments disclosed herein, but should be in coincidence with the widest scope in accordance with the principles and the novel characteristics disclosed in the present invention.

What is claimed is:

1. A high voltage LDMOS device, comprising: a substrate, an epitaxial layer located on the substrate, a drift region located on the epitaxial layer, and a drain region and a source region located at two ends of the LDMOS device respectively, wherein at least one pair of n-type semiconductor region and p-type semiconductor region are alternatively arranged adjacent to a lower surface of the drift region on an interface between the substrate and the epitaxial layer, the n-type semiconductor region is adjacent to the p-type semiconductor region to form a lateral PN junction mutually, and a longitudinal PN junction is formed between the n-type semiconductor region and the drift region or between the p-type semiconductor region and the drift region, wherein a portion of the drift region corresponding to the drain region is extended downwards through the interface between the substrate and the epitaxial layer.

2. The high voltage LDMOS device according to claim 1, further comprising: a buried layer added on an interface between the drift region and the n-type and p-type semiconductor regions, wherein the doping characteristic of the buried layer is opposite to that of the drift region.

3. The high voltage LDMOS device according to claim 1, further comprising: a top buried layer added to the upper surface of the drift region, wherein the doping characteristic of the top buried layer is opposite to that of the drift region.

4. The high voltage LDMOS device according to claim 1, further comprising: a buried layer added on an interface between the drift region and the n-type and p-type semiconductor regions, wherein the doping characteristic of the buried layer is opposite to that of the drift region.

5. The high voltage LDMOS device according to claim 1, further comprising: a top buried layer added to the upper surface of the drift region, wherein the doping characteristic of the top buried layer is opposite to that of the drift region.

* * * * *